(12) United States Patent
Kamada et al.

(10) Patent No.: US 6,214,508 B1
(45) Date of Patent: Apr. 10, 2001

(54) CIRCUIT-FORMING CHARGING POWDER AND MULTILAYER WIRING BOARD USING THE SAME

(75) Inventors: Akihiko Kamada; Isao Kato, both of Shiga-ken; Norio Sakai, Moriyama, all of (JP)

(73) Assignee: Murata Manufacturing Co., Ltd. (JP)

( * ) Notice: Subject to any disclaimer, the term of this patent is extended or adjusted under 35 U.S.C. 154(b) by 0 days.

(21) Appl. No.: 09/260,270

(22) Filed: Mar. 2, 1999

(30) Foreign Application Priority Data

Mar. 3, 1998 (JP) .................................................. 10-050544

(51) Int. Cl.[7] .............................. G03G 9/093; G03G 9/08
(52) U.S. Cl. ............................ 430/110; 430/111; 430/198
(58) Field of Search .................................. 430/106.6, 108, 430/110, 111, 198; 428/195

(56) References Cited

U.S. PATENT DOCUMENTS

| | | | |
|---|---|---|---|
| 4,740,443 | * | 4/1988 | Nakahara et al. .................... 430/110 |
| 4,822,708 | * | 4/1989 | Machida et al. ...................... 430/108 |
| 5,147,744 | * | 9/1992 | Sacripante et al. ................... 430/111 |
| 5,998,078 | * | 12/1999 | Suwabe et al. ....................... 430/110 |

FOREIGN PATENT DOCUMENTS 3-089359 * 4/1991 (JP) ...................................... 430/109

OTHER PUBLICATIONS

Diamond, Arthur S. (editor) Handbook of Imaging Materials. New York: Marcel–Dekker, Inc. pp. 168–169, 186–191, 1991.*
Chemical Abstracts Registry 84179–66–8, 2000.*

* cited by examiner

Primary Examiner—Christopher Rodee
(74) Attorney, Agent, or Firm—Ostrolenk, Faber, Gerb & Soffen, LLP

(57) ABSTRACT

A circuit-forming charging powder allowing circuit patterns to resist being peeled off a printing object when the powder is used for printing a circuit pattern by an electrophotographic method on the object, wherein the circuit-forming charging powder has a conductive metal powder, a charge control agent and an adhesion reinforcing agent combined with a heat-melt resin and a method for producing the circuit-forming charging powder, as well as printed objects and multilayer wiring boards are described.

20 Claims, 3 Drawing Sheets

CIRCUIT-FORMING CHARGING POWDER AND MULTILAYER WIRING BOARD USING THE SAME

BACKGROUND OF THE INVENTION

1. Field of the Invention

The present invention relates to a circuit-forming charging powder and a multilayer wiring board using the same, especially to a circuit-forming charging powder (toner) to be used in printing a circuit pattern on an object by electrophotography, and a multilayer wiring board using the same.

2. Description of the Related Art

Japanese Unexamined Patent Publication No. 4-236484 discloses a method for forming a desired circuit pattern on an insulating substrate by taking advantage of the electrostatic force used in conventional electrophotography, and a circuit-forming charging powder to be used in this wiring method. FIG. 1 shows a cross section of the conventional circuit-forming charging powder. The circuit-forming charging powder 100 with a mean particle size of 10 to 15 $\mu$m assumes a structure in which a conductive metal powder 101 and a charge control agent 102 are uniformly dispersed in a heat-melt resin 103. The practical method for producing the circuit-forming charging powder 100 comprises the steps of: mixing a flake-shaped silver powder with a mean particle size of 0.4 $\mu$m as a conductive metal powder 101, a metallic azo dye as a charge control agent 102 and a styrene-acrylic acid copolymer as a heat-melt resin 103 in a weight ratio of 80:1:19, respectively; and heat-melting the mixture followed by kneading with a kneader. Then, the mixture is roughly crushed with a cutter mill, finely crushed with a jet mill and classified with an air jet, thereby obtaining the circuit-forming charging powder 100.

However, the conventional circuit-forming charging powder involves a problem in that the circuit pattern can peel off the baked ceramic sheet when the powder is used for printing the circuit pattern on a ceramic green sheet by electrophotography because the ceramic green sheet shrinks during baking.

SUMMARY OF THE INVENTION

Accordingly, the object of the present invention, carried out for solving the problem described above, provides a circuit-forming charging powder having little possibility for allowing the circuit pattern to be peeled off the printing object even when the circuit pattern is printed on the printing object by electrophotography, and a multilayer circuit board using the same.

According to the present invention, the circuit-forming charging powder to be used for printing a circuit pattern on a printing object by electrophotography comprises a conductive metal powder, a heat-melt resin, a charge control agent and an adhesion reinforcing agent.

The conductive metal powder is a secondary powder comprising aggregates formed by aggregating a plurality of primary powders, and the printing object is a ceramic green sheet.

The multilayer wiring board according to the present invention is formed by laminating and baking the ceramic green sheets on which the circuit pattern is printed.

The circuit-forming charging powder according to the present invention contains the adhesion reinforcing agent, which serves for allowing the conductive metal powder used for forming the circuit pattern to adhere with the baked ceramic sheet when the ceramic green sheet on which the circuit pattern has been printed is baked. Accordingly, the adhesion strength between the baked ceramic sheet and the circuit pattern is improved after baking, preventing the circuit pattern from being peeled off the ceramic sheet.

Also, the conductive metal powder constituting the circuit-forming charging powder is a secondary powder comprising an aggregate prepared by aggregating a plurality of primary powders, the conductive metal powder comprising the secondary powder being dissociated into primary powders when the circuit-forming charging powder is fixed. Accordingly, the circuit pattern formed with the primary powders constituting the conductive metal powder is densely packed, allowing the sheet resistance of the circuit pattern to be further reduced along with decreasing the circuit pattern loss.

Also, the adhesion reinforcing agent contained in the circuit-forming charging powder serves to allow the conductive metal powder to be formed into the circuit pattern and adhered with the baked ceramic sheet when the ceramic sheet on which the circuit pattern has been printed. Consequently, the adhesion strength of the baked ceramic sheet with the circuit pattern is improved after baking, prevent the circuit pattern from being peeled off the ceramic sheet.

Also, the multilayer wiring board according to the present invention is produced by the steps comprising: printing the circuit pattern on the ceramic green sheet by the electrophotographic method using the circuit-forming charging powder containing the adhesion reinforcing agent; and laminating the ceramic green sheets followed by baking. Accordingly, the circuit pattern has essentially no possibility to be peeled off the baked ceramic sheet after baking, making it possible to improve quality and reliability of the multilayer wiring board that can be used in high frequency bands.

Also, the multilayer wiring board is produced by the steps comprising: preparing the circuit-forming charging powder containing the conductive metal powder comprising the secondary powder of aggregates of a plurality of primary powders; and laminating the ceramic green sheet, on which the circuit pattern is printed by the electrophotographic method using the circuit-forming charging powder, followed by baking. Therefore, ceramic sheet resistance and loss of the circuit pattern is reduced along while making it possible to use the multilayer wiring board in higher frequency bands.

Other features and advantages of the present invention will become apparent from the following description of the invention which refers to the accompanying drawings.

DESCRIPTION OF THE PREFERRED EMBODIMENT

Figure 1:
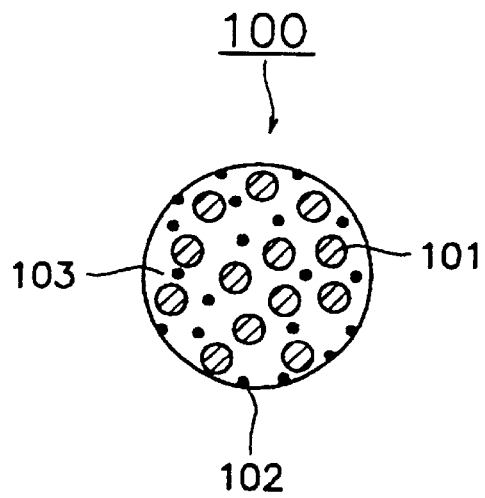
FIG. 1 shows a cross section of the conventional circuit-forming charging powder.
Figure 2:
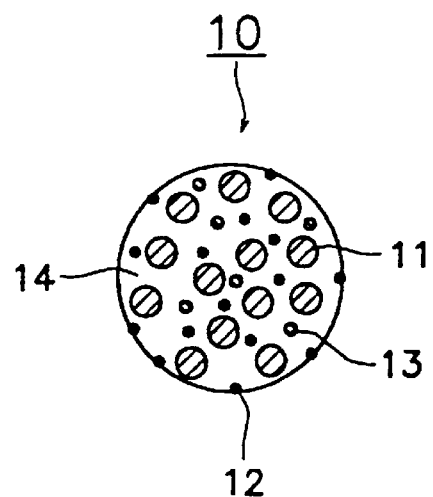
FIG. 2 shows a cross section of the circuit-forming charging powder according to the first preferred embodiment of the present invention.

FIG. 2 shows a cross section of the circuit-forming charging powder in the first preferred embodiment according to the present invention. The circuit-forming charging powder 10 assumes a structure in which a conductive metal powder 11, a charge control agent 12 and an adhesion reinforcing agent 13 are uniformly dispersed in a heat-melt resin 14.

A practical method for producing the circuit-forming charging powder 10 will be described. In the first step, spherical copper particles with a mean particle size of 0.8 μm as the conductive metal powder 11, a metallic azo dye as a charge control agent 12, silica as an adhesion reinforcing agent 13 and a styrene-acrylic acid copolymer as a heat-melt resin 14 are mixed in a weight ratio of 93:1:1:5, respectively.

In the next step, the mixture is heat-melted and kneaded in a kneader, followed by a rough crushing with a cutter mill and a fine crushing with a jet mill. The circuit-forming charging powder 10 with a mean particle size of 8.0 μm is obtained by classification with air jet.

According to the circuit-forming charging powder in the first preferred embodiment, the adhesion reinforcing agent contained therein serves for reinforcing the adhesion of the printing object with the conductive metal powder to be formed into a circuit pattern, preventing the circuit pattern from being peeled off the printing object due to enhanced adhesion strength of the printing object with the circuit pattern.

The content of the adhesion reinforcing agent contained in the circuit-forming charging powder can be desirably adjusted since it is kneaded with the heat-melt resin, enabling adhesion strength of the baked ceramic green sheet with the circuit pattern to be adjusted. A large quantity of the adhesion reinforcing agent may be even contained in the circuit-forming charging powder in order to obtain higher adhesion strength.

When the printing object is a ceramic green sheet, the adhesion reinforcing agent contained in the circuit-forming charging powder serves to allow the conductive metal powder forming the circuit pattern to adhere to the baked ceramic sheet during baking of the ceramic green sheet on which the circuit pattern has been formed. Therefore, adhesion strength of the baked ceramic sheet with the circuit pattern is enhanced to prevent the circuit pattern from being peeled off the ceramic sheet.

Figure 3:
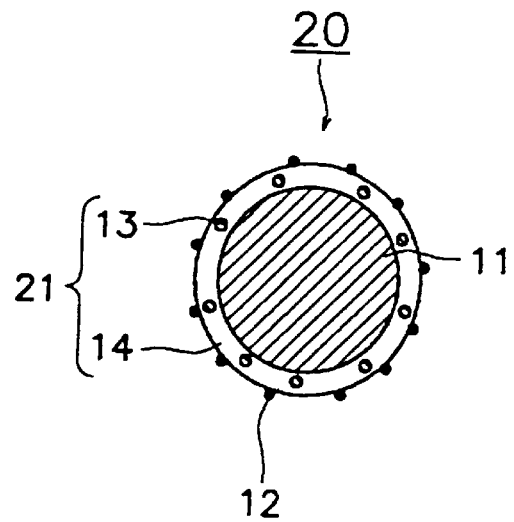
FIG. 3 shows a cross section of the circuit-forming charging powder according to the second preferred embodiment of the present invention.

FIG. 3 shows a cross section of the circuit-forming charging powder according to the second preferred embodiment of the present invention. An outer wall 21 comprising the adhesion reinforcing agent 13 and heat-melt resin 14 is formed around the conductive metal powder 11 in the circuit-forming charging powder 20, assuming a structure in which the charge control agent 12 is adhered on the surface of the outer wall 21.

A practical method for producing the circuit-forming charging powder 20 will be described hereinafter. In the first step, copper particles with a mean particle size of 5.0 μm as the conductive metal powder 11 and particles, obtained by mixing silica as the adhesion reinforcing agent 13 and a styrene-acrylic acid copolymer as the heat-melt resin 14 in a weight ratio of 1:5 followed by finely crushing, are mixed in a weight ratio of 93:6, allowing the particles comprising the adhesion reinforcing agent 13 and heat-melt resin 14 to adhere on the conductive metal powder 11 by electrostatic force.

In the next step, a mechanical impact force is applied to the product obtained by adhering the particles comprising the adhesion reinforcing agent 13 and the heat-melt resin 14 to the conductive metal powder 11 to form an outer wall 21 comprising the adhesion reinforcing agent 13 and heat-melt resin 14 around the conductive metal powder 11.

In the third step, the product prepared by forming the outer wall comprising the adhesion reinforcing agent 13 and heat-melt resin 14 around the conductive metal powder 11, and a azo metallic dye as the charge control agent 12 are mixed in a weight ratio of 99:1, followed by applying a mechanical impact force to form a circuit-forming charging powder 20 with a mean particle size of 8.0 μm in which the charge control agent 12 is adhered on the surface of the outer wall 21. In other words, the outer wall 21 comprising the adhesion reinforcing agent 13 and heat-melt resin 14 is formed around the conductive metal powder 11 to obtain the circuit-forming charging powder 20 on the surface of which the charge control agent 12 is adhered.

In the circuit-forming charging powder according to the second preferred embodiment described above, a circuit-forming charging powder that can be uniformly charged is obtained by adhering the charge control agent on the surface of the outer wall formed around the conductive metal powder. Accordingly, use of this circuit-forming charging powder allows the charge to be more easily controlled as well as improving the printing affinity for complying with circuit patterns having narrow intervals, making it possible to form a circuit pattern with low sheet resistance.

The conductive metal powder is prevented from being exposed on the surface of the circuit-forming charging powder because the outer wall comprising the adhesion reinforcing agent and heat-melt resin is formed around the conductive metal powder. Therefore, the charging ability of the circuit-forming charging powder is improved by preventing deterioration of charging ability ascribed to the conductive metal powder, consequently improving printing affinity even more to comply with the circuit pattern having narrower intervals.

The quantity of the adhesion reinforcing agent contained in the circuit-forming charging powder can be adjusted to a desirable level since it is kneaded with the heat-melt resin forming the outer wall, thereby enabling one to adjust the adhesion strength of the baked ceramic sheet with the circuit pattern. In order to reinforce the adhesion strength, a large amount of the adhesion reinforcing agent can be also included in the circuit-forming charging powder.

Figure 4:
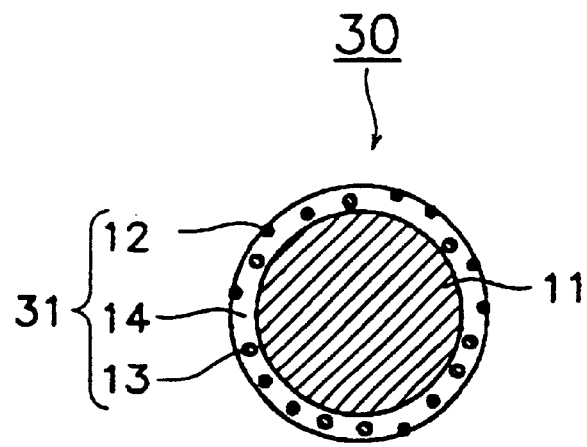
FIG. 4 shows a cross section of the circuit-forming charging powder according to the third preferred embodiment of the present invention.

FIG. 4 shows a cross section of the circuit-forming charging powder according to the third preferred embodiment of the present invention. The circuit-forming charging powder 30 assumes a structure comprising the charge control agent 12, adhesion strength reinforcing agent 13 and heat-melt resin 14 formed around the conductive metal powder 11.

A practical method for producing the circuit-forming charging powder 30 will be described hereinafter. In the first step, copper particles with a mean particle size of 5.0 μm as the conductive metal powder and particles, prepared by mixing a metallic azo dye as the charge control agent 12, silica as the adhesion reinforcing agent 13 and a styrene-acrylic acid copolymer as the heat-melt resin 14 in a weight ratio of 1:1:5 followed by finely crushing, were mixed in a weight ratio of 93:7, thereby allowing the particles comprising the charge control agent 12, adhesion reinforcing agent 13 and heat-melt resin 14 to adhere on the conductive metal powder 11.

In the next step, a mechanical impact force is applied to the conductive metal powder 11 adhered with particles composed of the charge control agent 12, adhesion reinforcing agent 13 and heat-melt resin 14, thus obtaining the circuit-forming charging powder 30 with a mean particle size of 8.0 $\mu$m in which an outer wall comprising the charge control agent 12, adhesion reinforcing agent 13 and heat-melt resin 14 is formed around the conductive metal powder 11.

In the circuit-forming charging powder according to the third preferred embodiment, the surface of the circuit-forming charging powder is not required to be separately adhered with the charge control agent because the outer wall comprising the charge control agent, adhesion reinforcing agent and heat-melt resin has been formed around the conductive metal powder, enabling one to simplify the production process, as well as to reduce the production cost, of the circuit-forming charging powder.

As shown in the foregoing first to third preferred embodiments, increasing the content of the conductive metal powder in the circuit-forming charging powder to more than about 90 wt %, e.g., to 93 % wt, allows the film thickness of the circuit pattern to be thicker by use of one printing process. Therefore, the sheet resistance of the circuit pattern can be reduced as well as diminishing the circuit pattern loss, thus allowing the multilayer printed board obtained by using this circuit-forming charging powder to be used in high frequency bands.

Forming a thick circuit pattern in one printing makes it possible to simplify the production process of the circuit pattern, reducing the production cost of the multilayer wiring board. Shift and deformation of the printed circuit pattern may be also avoided to further improve the quality of the multilayer wiring board.

In addition, since the content of the heat-melt resin in the circuit-forming charging powder can be reduced to less than about 10 wt %, e.g., to 5 wt %, frequency of delamination between the circuit pattern and baked ceramic sheet that occurs due to complete combustion of the heat-melt resin during baking can be reduced, enabling one to form a more reliable circuit pattern.

The content of the conductive metal powder is preferably less than about 98% by weight since when the content of the conductive metal powder is more than about 98% by weight, it becomes difficult to perfectly cover the conductive metal powder with the heat-melt resin without exposing the powder surface.

Figure 5:
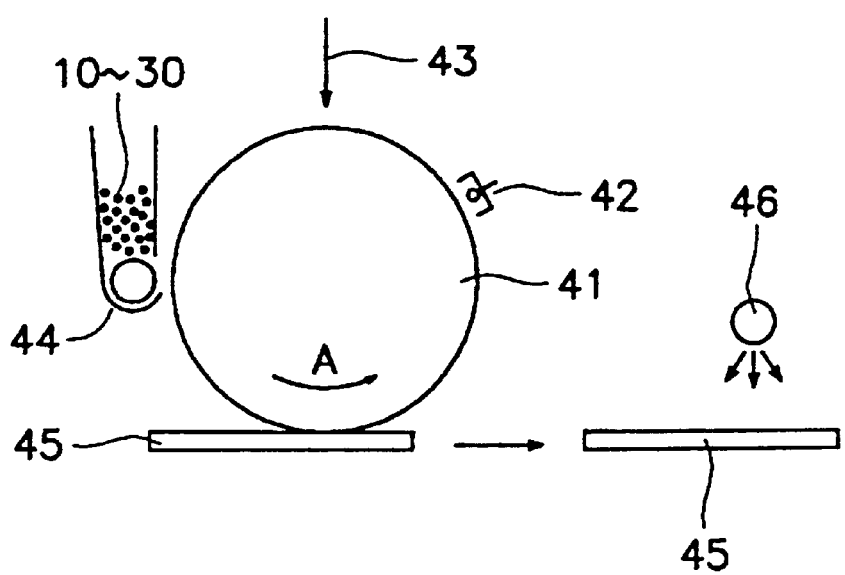
FIG. 5 illustrates the structure of the electro-photographic system to be used in forming the circuit pattern on the printing object.

FIG. 5 illustrates the construction of the electrophotographic system to be used in forming the circuit pattern on the printing object. Forming the circuit pattern on the printing object comprises the steps of: charging the surface of a photosensitive member 41 with a corona charging device 42; exposing the surface of the photosensitive member 41 rotating along the direction indicated by an arrow A by irradiating with a laser beam 43 to form latent images (not shown in the drawing); developing the latent image on the surface of the photosensitive member 41 by electrostatic adsorption of the circuit-forming charging powder 10 to 30 fed from a feed means 44; transferring the circuit-forming charging powder 10 to 30 developed on the latent image pattern on the printing object 45 by rotating the photosensitive member 41; and fixing the circuit-forming charging powder 10 to 30 transferred on the printing object 45 by irradiating with a flash lamp 46 to form the circuit pattern (not shown in the drawing) on the printing object 45.

Figure 6:
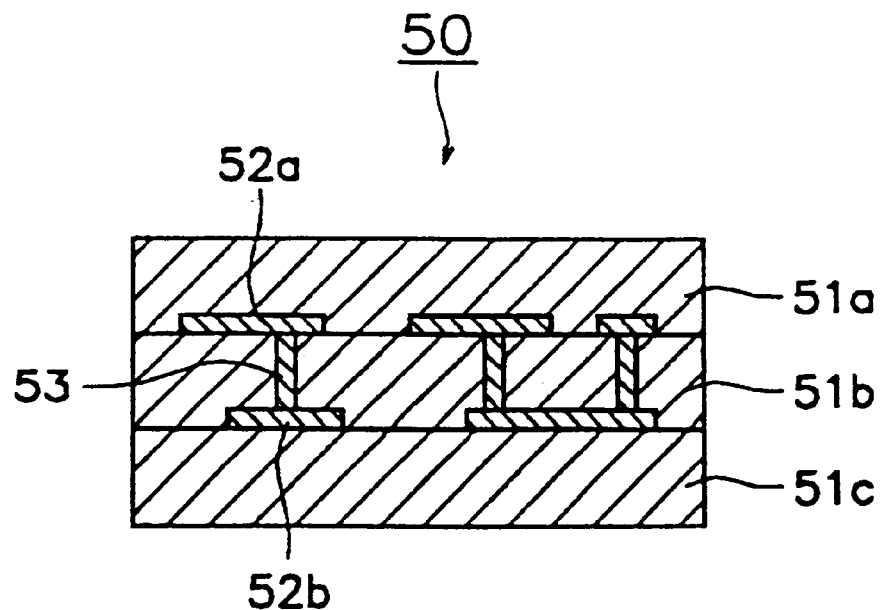
FIG. 6 shows a cross section of the multilayer wiring board according to the present invention.

FIG. 6 shows a cross section of a multilayer wiring board according to one preferred embodiment of the present invention. The multilayer wiring board 50 is provided with the first, second and third green sheets represented by 51a, 51b and 51c, respectively. Circuit patterns 52a and 52b are printed on the first green sheet 51a and second green sheet 51b using the circuit-forming charging powder 10 to 30 (FIG. 2 to FIG. 4) in the foregoing first to third preferred embodiments with the electro-photographic system in FIG. 4. Then, the ceramic green sheets 51a to 51c are laminated under pressure to form a monolithic member followed by baking.

The circuit patterns 52a and 52b on the ceramic green sheets 51a and 51b are put into electrical continuity with pier holes 53, which can be formed using currently available technologies. For example, a pier hole is produced by injecting electric conductors for each pier hole using a conductor drawing apparatus. It is preferable in this method to form the pier hole 53 prior to forming the circuit patterns 52a and 52b since the powder may possibly damage the nozzle of the drawing apparatus when the pier hole 53 is formed after forming the circuit patterns 52a and 52b by the electrophotographic method.

The multilayer wiring board as described above is produced by printing the circuit pattern by the electrophotographic method on the ceramic green sheet, followed by laminating and baking the green sheets. Consequently, there is essentially no possibility that the circuit pattern is peeled off the baked ceramic sheet, thus improving the quality and reliability of the multilayer wiring board. Accordingly, the multilayer wiring board can be used in high frequency bands.

Although copper was used for the circuit forming charging powder in the first to third embodiments, the same effect as described in these embodiments can be obtained by using a metal such as gold, silver, nickel, palladium or molybdenum, or an alloy comprising two or more kinds of these metals. The materials used heretofore can also be used in this invention.

Although a styrene-acrylic acid copolymer was used for the heat-melt resin in the foregoing embodiments, the same effect as described in these embodiments can be obtained by using a resin such as polymethyl methacrylate resin, crosslinked acrylic acid resin, polystyrene resin, polyethylene resin, fluorinated resin, fluorinated vinylidene resin and benzoguanamine resin, or a mixture of two or more of these resins. The materials used heretofore can also be used in this invention.

Although a metallic azo dye was used for the charge control agent in the examples, the same effect as described in the foregoing embodiments can be obtained by using a negatively charged charge control agent such as a chlorinated paraffin, a chlorinated polyester, an acid-excess polyester, a sulfonylamine naphthenic acid metal salt of copper phthalocyanine, a metal salt of fatty acid and resinate soap, or a mixture of two or more of these compounds. The materials used heretofore can also be used in this invention.

Although silica glass was used for the adhesion reinforcing agent above, the same effect as described in the foregoing embodiments can be obtained by using a substance such as borolilicate glass, soda lime, lead glass and aluminosilicate glass, or a glass comprising a mixture of two or more of these substances, or a ceramic comprising alumina and ferrite.

Figure 7:
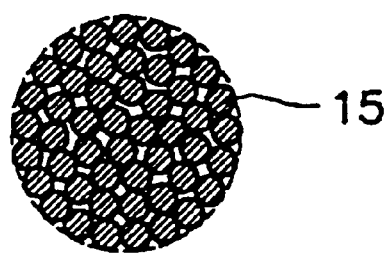
FIG. 7 shows one example of the cross section of the conductive metal powder constituting the circuit-forming charging powder shown in FIG. 2 to FIG. 4.

As shown in FIG. 7, the conductive metal powder 11 constituting the circuit-forming charging powders 10 to 30 may be a secondary powder comprising an aggregate in which a plurality of primary powders 15 are aggregated. Since the conductive metal powder 11 comprising the secondary powders is dissociated into the primary powders 15 when the circuit-forming charging powders 10 to 30 are fixed, packing of the circuit pattern formed by the primary powder 15 constituting the conductive metal powder is made dense, making it possible to further reduce the sheet resistance of the circuit pattern along with further decreasing the circuit pattern loss. Consequently, the multilayer wiring board produced by using this circuit-forming charging powder can be used in higher frequency bands. It is especially preferable for obtaining a spherical secondary powder that the particle size of the primary powder is within the range of 1/5 to 1/20 of the particle size of the circuit-forming charging powder.

It is preferable that the particle size of the circuit-forming charging powder is in the range of about 3 to 20 $\mu$m for enhancing the effect of the present invention.

Although the adhesion reinforcing agent contained in the circuit-forming charging powder is kneaded with the heat-melt resin and incorporated into the outer wall in the circuit-forming charging powder according to the second and third preferred embodiments, the agent may be adhered on the surface of the circuit-forming charging powder, or on the surface of the outer wall, without being kneaded with the heat-melt resin.

The structure in which the charge control agent is adhered on the periphery of the circuit-forming charging powder, or the structure in which charge control agent is adhered on the surface of the outer wall comprising the charge control agent, adhesion reinforcing agent and heat-melt resin can display the same effect in the circuit-forming charging powder according to the third preferred embodiment.

While the invention has been particularly shown and described with reference to preferred embodiments thereof, it will be understood by those skilled in the art that the forgoing and other changes in form and details may be made therein without departing from the spirit of the invention.

What is claimed is:

1. A circuit-forming charging powder for use in printing a circuit pattern on an object by electrophotography, comprising a conductive metal powder, a heat-melt resin, a charge control agent and an adhesion reinforcing agent;
   wherein the conductive metal powder, the charge control agent and the adhesion reinforcing agent are uniformly dispersed in the heat-melt resin, and wherein said conductive metal is at least one member selected from the group consisting of copper, gold, silver, nickel, palladium and molybdenum.

2. The circuit-forming charging powder according to claim 1, wherein said charge control agent is at least one member selected from the group consisting of a metallic azo dye, a chlorinated paraffin, a chlorinated polyester, an acid-excess polyester, a sulfonylamine naphthenic acid metal salt of copper phthalocyanine, a metal salt of fatty acid and resinate soap.

3. The circuit-forming charging powder according to claim 1, wherein said adhesion reinforcing agent is at least one member selected from the group consisting of silica glass, borosilicate glass, soda lime, lead glass, aluminosilicate glass, alumina and ferrite.

4. A ceramic green sheet having a circuit pattern which comprises the circuit-forming charging powder according to claim 3 thereon.

5. The circuit-forming charging powder according to claim 1, wherein the particle size of said circuit-forming charging powder is in the range of about 3 to 20 $\mu$m.

6. The circuit-forming charging powder according to claim 1, wherein the content of said conductive metal powder in the circuit-forming charging powder is more than about 90 wt % and less than or equal to about 98 wt %.

7. The circuit-forming charging powder according to claim 1, wherein the content of said heat-melt resin in the circuit-forming charging powder is less than about 10 wt %.

8. The circuit-forming charging powder according to claim 7, wherein the content of said conductive metal powder in the circuit-forming charging powder is more than about 90 wt % and less than or equal to about 98 wt %. and wherein the particle size of said circuit-forming charging powder is in the range of about 3 to 20 $\mu$m.

9. The circuit-forming charging powder according to claim 8, wherein said adhesion reinforcing agent is at least one member selected from the group consisting of silica glass, borosilicate glass, soda lime, lead glass, aluminosilicate glass, alumina and ferrite.

10. The circuit-forming charging powder according to claim 9, wherein said conductive metal is at least one member selected from the group consisting of copper, gold, silver, nickel, palladium or molybdenum, and wherein said charge control agent is at least one member selected from the group consisting of a metallic azo dye, a chlorinated paraffin, a chlorinated polyester, an acid-excess polyester, a sulfonylamine naphthenic acid metal salt of copper phthalocyanine, a metal salt of fatty acid and resinate soap.

11. An aggregate of a plurality of circuit-forming charging powder particles according to claim 10.

12. A ceramic green sheet having a circuit pattern which comprises the circuit-forming charging powder according to claim 11 thereon.

13. An aggregate of a plurality of circuit-forming charging powder particles according to claim 1.

14. A ceramic green sheet having a circuit pattern which comprises the circuit-forming charging powder according to claim 13 thereon.

15. A ceramic green sheet having a circuit pattern which comprises the circuit-forming charging powder according to claim 1 thereon.

16. A circuit-forming charging powder for use in printing a circuit pattern on an object by electrophotography, comprising a conductive metal powder, a heat-melt resin, a charge control agent and an adhesion reinforcing agent;
   wherein an outer wall comprising the adhesion reinforcing agent and the heat-melt resin surrounds the conductive metal powder, and the charge control agent is adhered on the surface of the outer wall.

17. An aggregate of a plurality of circuit-forming charging powder particles according to claim 16.

18. A ceramic green sheet having a circuit pattern which comprises the circuit-forming charging powder according to claim 16 thereon.

19. The circuit-forming charging powder according to claim 16, wherein said conductive metal is at least one member selected from the group consisting of copper, gold, silver, nickel, palladium and molybdenum.

20. A ceramic green sheet having a circuit pattern which comprises the circuit-forming charging powder thereon,
   wherein said circuit-forming charging powder comprises a conductive metal powder, a heat-melt resin, a charge control agent and an adhesion reinforcing agent; and
   wherein the charge control agent, the adhesion reinforcing agent and the heat-melt resin surround the conductive metal powder.

* * * * *